US005105906A

United States Patent [19]

Wegner

[11] Patent Number: 5,105,906

[45] Date of Patent: Apr. 21, 1992

[54] SOUND REPRODUCTION SPEAKER WITH IMPROVED DIRECTIONAL CHARACTERISTICS

[75] Inventor: Arthur C. Wegner, Spokane, Wash.

[73] Assignee: Soundhour Electronic Corporation, Spokane, Wash.

[21] Appl. No.: 509,567

[22] Filed: Apr. 16, 1990

[51] Int. Cl.[5] .................... H05K 5/00

[52] U.S. Cl. .................... 181/156; 181/148; 181/199; 381/159

[58] Field of Search .................... 181/144, 145, 147, 148, 181/156, 199, 146, 154, 155; 381/159

[56] References Cited

U.S. PATENT DOCUMENTS 1,984,550 2/1934 Sandeman .................... 381/159
2,766,839 10/1956 Baruch et al. .................... 181/146
4,006,308 2/1977 Ponsgen .................... 181/147 X
4,014,597 3/1977 Griffin, Jr. .................... 181/199 X
4,190,738 2/1980 Samuels .................... 181/199 X
4,199,657 4/1980 Lane .................... 181/145 X
4,224,467 9/1980 Lewis et al. .................... 181/154 X
4,268,719 5/1981 Manger .................... 181/144 X
4,418,243 11/1983 Fixler .................... 181/144 X
4,445,227 11/1984 Leiendecker et al. .................... 181/155 X
4,512,434 4/1985 Yoo .................... 181/145 X
4,714,133 12/1987 Skaggs, Jr. .................... 181/199 X

FOREIGN PATENT DOCUMENTS 937872 9/1963 United Kingdom .................... 181/144

*Primary Examiner*—Brian W. Brown
*Attorney, Agent, or Firm*—Wells, St. John & Roberts

[57] ABSTRACT

An isosceles shaped sound reproduction speaker 70 is illustrated in the accompanying drawings and described in the specification. The speaker has isosceles sides that extend upward from an apex 86 at an internal angle of between 74.5° and 79° and preferably 78.4°. The width of the enclosure is substantially equal to the circumference of the piston diameter of the primary dynamic, direct radiation diaphragm, low-to-mid frequency range driver 94 mounted in the front wall. The height "C" of the enclosure 71 is substantially equal to or less than the width "B" of the enclosure. The speaker 70 has a secondary dynamic diaphragm driver 98 mounted in the rear wall that is connected electrically in series with the front wall driver 94. The enclosure 71 has an upper fundamental resonance frequency of 2978 Hz±3%. The front and rear drivers 94 and 98 have free air resonance frequencies that are 55 Hz±3%. The speaker has a very wide directional wave propagation characteristics permitting the rather small unit to be utilized in a relatively large space.

64 Claims, 5 Drawing Sheets

SOUND REPRODUCTION SPEAKER WITH IMPROVED DIRECTIONAL CHARACTERISTICS

TECHNICAL FIELD

This invention relates to sound reproduction speakers having improved directional properties.

BACKGROUND OF THE INVENTION

More than one year prior to the filing date of this invention, the applicant designed and sold a triangular-shaped sound reproduction speaker generally illustrated in FIGS. 1-6.

Such prior art sound reproduction speaker, generally designated with the numeral 20, has an isosceles shaped enclosure 22 having a front wall 24, a rear wall 26, an isosceles side wall 28, an isosceles side wall 30 and a width side wall 32. Side walls 28 and 30 merged at an apex 34 having an angle of approximately 90°. The intersection of side walls 28 and 30 with the side wall 32 form corners 36 and 38 respectively each having an angle of approximately 45°. Additionally the height between the apex 34 and a normal distance to the side wall 32 was less than the width as defined by the length of the side wall 32.

The speaker 20 has a front mid-to-low frequency range sound reproduction element or driver 40 mounted in the front wall 24. Such sound reproduction element 40 is of a direct radiation, diaphragm type driver having a permanent magnet used in operation with a voice coil for driving the diaphragm.

Additionally the speaker 20 has a rear low-to-mid frequency range sound reproduction element or driver 44 of the same type as element 40. The rear driver 44 is mounted in the rear wall for creating and producing sound waves directed outward from the rear wall 26.

Additionally speaker 20 had a front mid-to-upper frequency range sound reproduction element 45 mounted above the low-to-mid frequency range element 40. Alternatively, the speaker 20 included a second mid-to-upper range element 46 that was mounted adjacent to the element 44 (FIGS. 3 and 6). Each of the mid-to-upper frequency range elements 45, 46 utilize a solid state piezoelectric transducer. The speaker 20 included a grill 47 overlying the front wall 24 to improve the aesthetics of the enclosure 22 and to provide a dust cover for the front driver 40.

FIG. 2 illustrates a polar graph 48 of the directional performance of the prior art speaker illustrated in FIG. 1. A constant intensity pattern line 50 is illustrated in a 360° polar direction at a frequency of approximately 500 Hz. The polar graph 48 was made about a vertical axis in which the speaker is mounted at the axis. In viewing the pattern 50, one will note a frontal lobe 52 that has a rather narrow directional intensity pattern of less than 120°. Similarly an opposite rear lobe 53 is provided that additionally has an intensity pattern or segment of less than 120°. The pattern line 50 additionally has side lobes 54 and 55 in which there are significant quadrant intensity depressions between the lobs 52-55. An electrical schematic 58 for speaker 20 is shown in FIG. 6. The electrical schematic 58 includes an amplified AC power signal line 60 and a ground or common line 62 for electrically connecting the speaker to an audio amplifier. It should be noted that the mid-to-low range sound reproduction drivers 40 and 42 are mounted in series between the AC signal lines 60 and the common line 62 in which the polarity of the drivers are inverted with the rear driver 42 firstly connected to the power singal line 60 at its positive terminal. An interconnecting line 63 connects the negative terminal of the rear element 42 with the positive terminal of the front element 40. The ground line is connected to the negative terminal of the front element 40. Consequently the AC signal from the amplifier to the front element 40 is first attenuated by the rear element 42.

The mid-to-upper range elements or drivers 44 and 45 are mounted in parallel with both of the low-to-mid range drivers 40 and 42. Time aligned capacitors 64 and 66 are connected in series with the mid-to-upper range drivers 44 and 45 as illustrated in FIG. 6. The mid-to-upper range drivers 44 and 45* have their positive terminals connected to line 60 and their negative terminals connected to the ground or common line 62. Consequently the output of the mid-to-upper range drivers 44 and 45 are time delayed with respect to the low-to-mid frequency range drivers 40 and 42.

Although the speaker 20 operated reasonably well and had some commercial success, applicant has developed a new triangular-shaped speaker having considerably better directional characteristics with reduced power requirements and which is capable of operating more satisfactorily over the wide range of acoustical frequencies from 25 Hz to 2000 Hz.

BRIEF DESCRIPTION OF THE DRAWINGS

The preferred embodiment of the invention is illustrated in the accompanying drawings, in which.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

Figure 13:
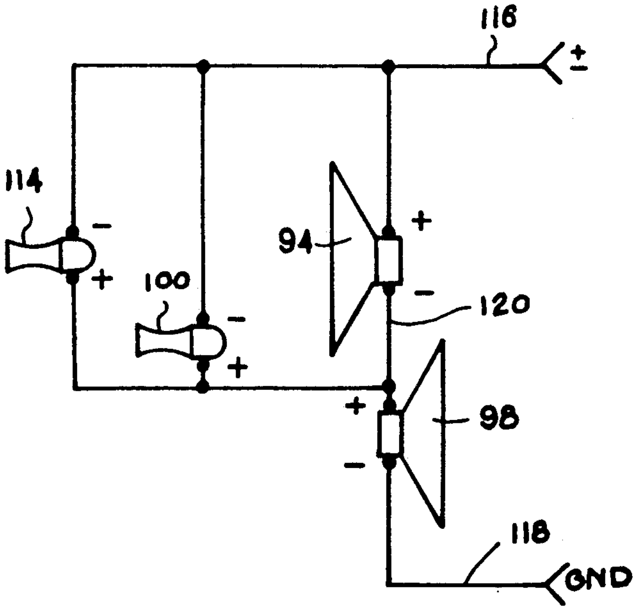
FIG. 13 is an electrical schematic view of an electrical circuit of an alternate embodiment to the embodiment shown in FIG. 7 in which the alternate embodiment contains two upper range sound reproduction elements.
Figure 14:
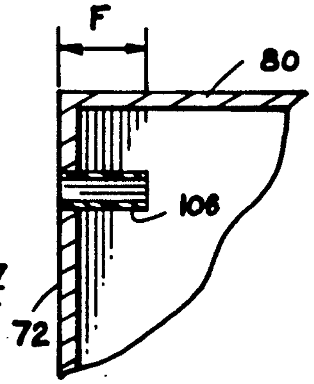
FIG. 14 is a enlarged cross-sectional taken along line 14—14 in FIG. 7 illustrating details of a front port.
Figure 15:
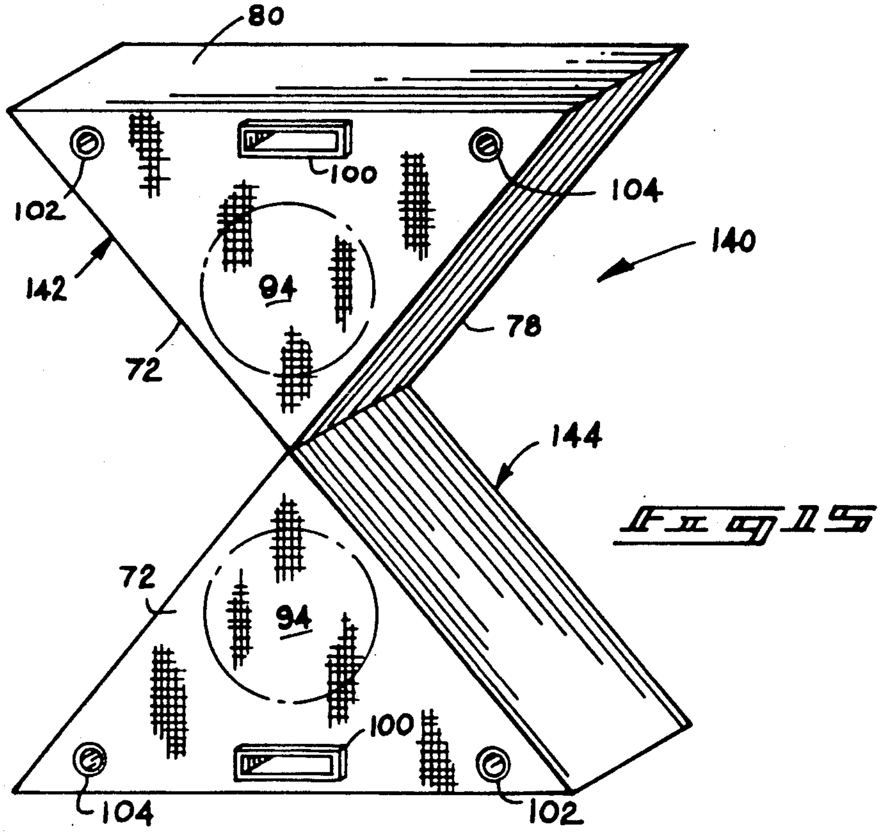
FIG. 15 is an isometric view of a further alternate embodiment of an hourglass shaped sound reproduction speaker.
Figure 16:
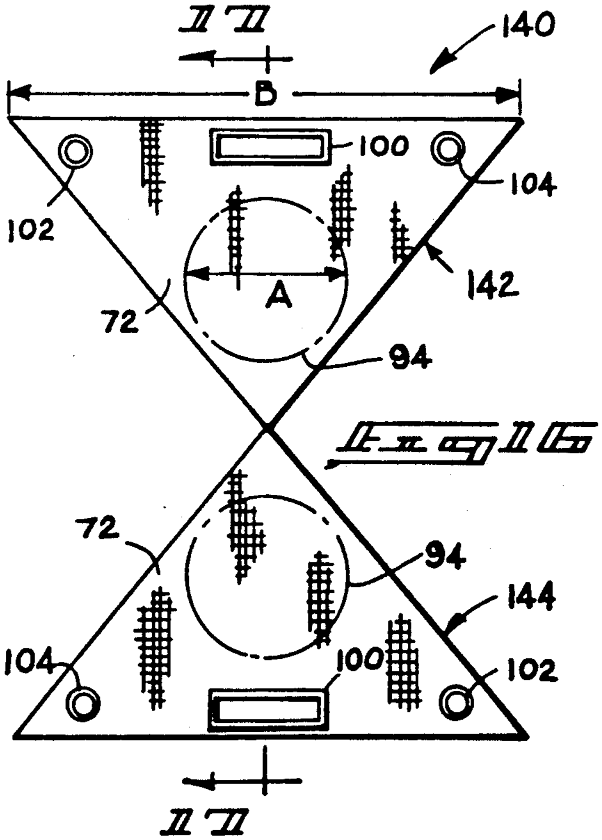
FIG. 16 is a front view of the speaker shown in FIG. 15.
Figure 17:
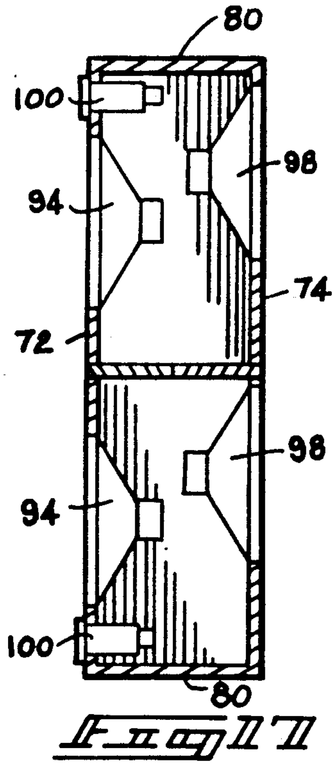
FIG. 17 is a vertical cross sectional view taken along line 17—17 in FIG. 16.

Preferred and alternate embodiments of this invention are illustrated in FIGS. 7-17 with one embodiment being illustrated in FIGS. 1-14 and a second embodiment being illustrated in FIGS. 15-17.

Figure 7:
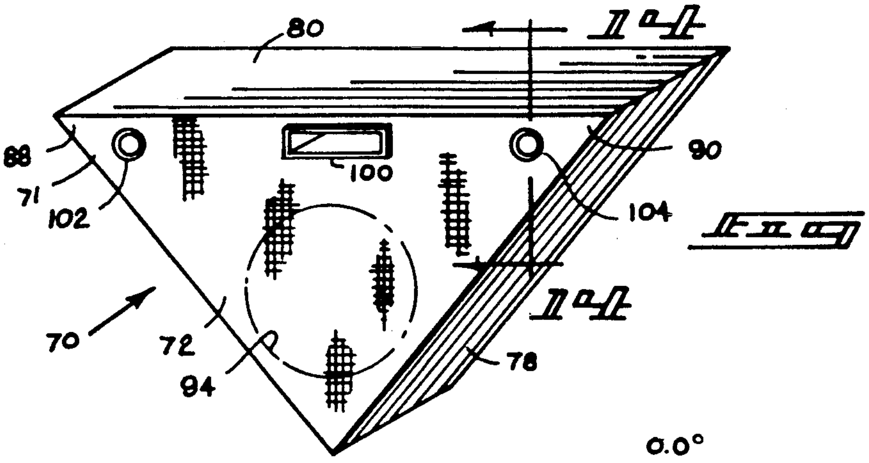
FIG. 7 is an isometric view of a preferred embodiment of a triangular shaped sound reproduction speaker of the present invention.
Figure 8:
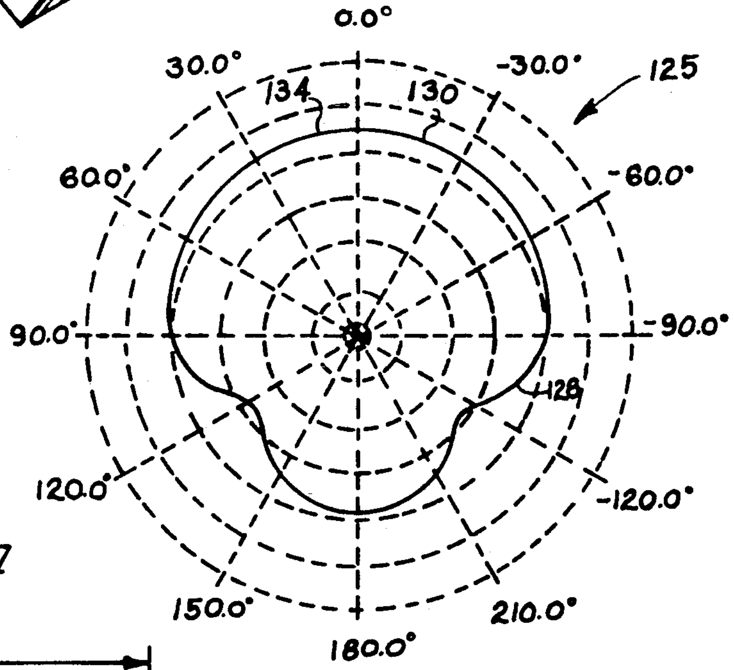
FIG. 8 is a polar graph illustrating the directional properties of the speaker shown in FIG. 7.
Figure 11:
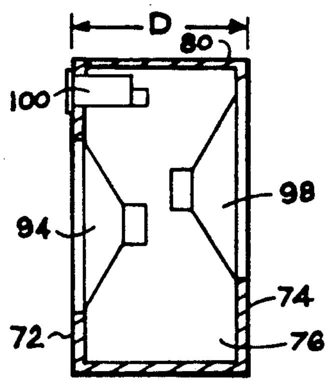
FIG. 11 is a vertical cross view of the speaker shown in FIG. 7 taken along line 11—11 in FIG. 9.

The embodiment illustrated in FIG. 7 is referred to as a sound reproduction speaker 70 that has a speaker enclosure 71 with a front wall 72, a rear wall 74 and side walls 76, 78 and 80 that form the enclosure. The front and rear walls are isosceles triangular shaped walls having side walls 76, 78 and 80 extending therebetween. The front and rear walls are parallel and spaced from each other in a dimension referred to as the depth "D" (FIG. 11).

The front wall 72 (FIG. 9) has an isosceles side edge 82 and an isosceles side edge 84 that extends outwardly from an apex 86. The side edges 82 and 84 extend upward to a side or top edge 87. The length of the side edge 87 defines a width dimension "B" of the enclosure 71. The intersection of the side edges 82 and 84 with the side edge 87 forms corners 88 and 90. The internal angle $\alpha$ of the apex 86 of the present invention is between 74.5° and 79°. The applicant has found by extensive testing and experimentation that the most preferable apex angle $\alpha$ is 78.4° to obtain the optimum performance.

The rear wall 74 (FIG. 10), as previously mentioned, is parallel with and spaced from the front wall 72. The rear wall 74 is a mirror image of the front wall 72. Both the front wall 72 and the rear wall 74 have a center of the isosceles triangle identified with the numeral 92.

Figure 9:
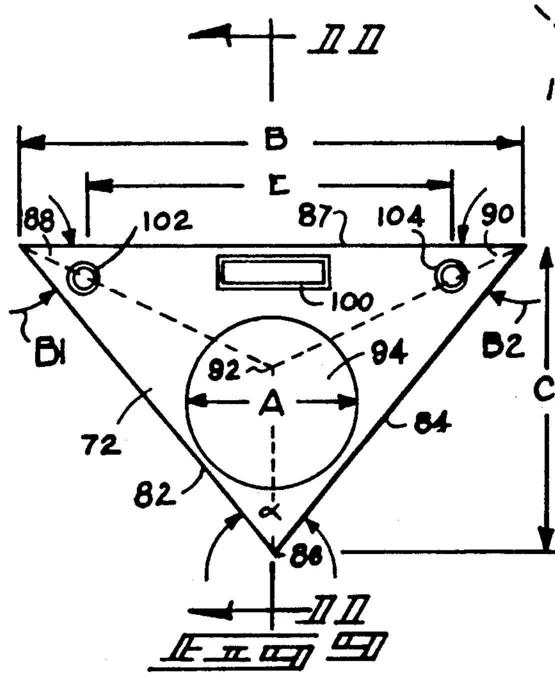
FIG. 9 is a front view of the speaker shown in FIG. 7.

The speaker 70 includes, as an essential component, a primary sound reproduction element or driver 94 generally of a low-to-mid frequency range. The element 94 is formed of a dynamic, direct radiation diaphragm driver that is operable by a voice coil in conjunction with a permanent magnet. The diaphragm of the element 94 has a piston diameter "A" (FIG. 9). It should be noted that the piston diameter "A" of the diaphragm is generally less than the nominal size of the element 94. For example, a nominal size eight inch low-to-mid range driver 94 normally may have a piston or diaphragm cone diameter (not including the outer suspension or surround) of approximately seven inches ±3%. Consequently the piston diameter "A" refers to the diameter of the actual diaphragm without its outer suspension rather than the nominal size of the driver. For a piston diameter "A" of seven inches, the piston circumference is twenty-two inches.

Furthermore in a preferred embodiment, the applicant has found that the primary sound reproduction element 94 should have a free air resonance frequency of 55 Hz±3%.

An important feature of this invention is that the width "B" of the enclosure should be substantially equal ±3% to the piston circumference ($\pi$A) of the primary sound reproduction element 94. For example, if the piston diameter "A" is seven inches then the piston circumference is approximately twenty-two inches and defines the width "B" of the enclosure 71. A further important relationship is that the height "C" of the enclosure 71, determined from the apex 86 to the side edge 87, is equal to or less than the width "B". Stated in a different way, the height "C" is equal to or less than the piston circumference of the primary sound reproduction element 94. For a enclosure 71 having a width "B" that equals twenty-two inches, the low fundamental resonance frequency of the enclosure is approximately 614 Hz (the first order resonance frequency).

A further preferred relationship is that the depth illustrated with numeral "D", shown in FIG. 11, is one-half ±3% of the width "B". Furthermore in the preferred embodiment, the primary sound reproduction element 94 is mounted in the front wall 72 closer to the side edges 82 and 84 than to the side edge 87. Preferably the element 94 is mounted as close to the apex 86 as is reasonably possible so that the center of the driver 94 is below the center 92 of the isosceles triangle of the front wall 72 as illustrated in FIG. 9.

Figure 10:
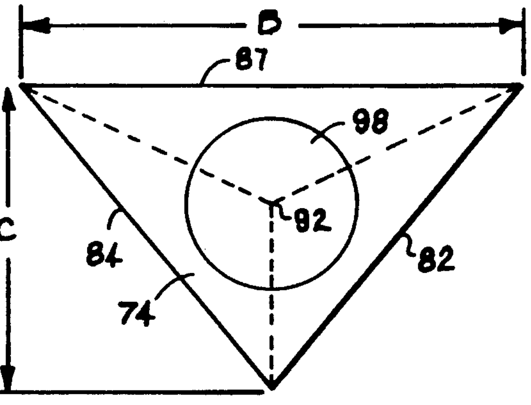
FIG. 10 is a rear view of the speaker shown in FIG. 7.

The speaker 70 further includes a secondary sound reproduction element or driver 98 of a low-to-mid frequency range that is mounted in the rear wall 74 as illustrated in FIGS. 10 and 11. Preferably, the secondary sound reproduction element or driver 98 is of the same type as the primary driver 94. Preferably the driver 98 is a dynamic, direct radiation diaphragm type having a voice coil that is operable in conjunction with a permanent magnet. The secondary driver 98 preferably has a size that is equal to or larger than the primary driver 94. Preferably, the secondary driver 98 is centrally located coaxial with the center 92 of the isosceles triangle (FIG. 10). Additionally it is preferable that the free air resonance frequency of the secondary driver 98 be 55 Hz±3%.

Figure 1:
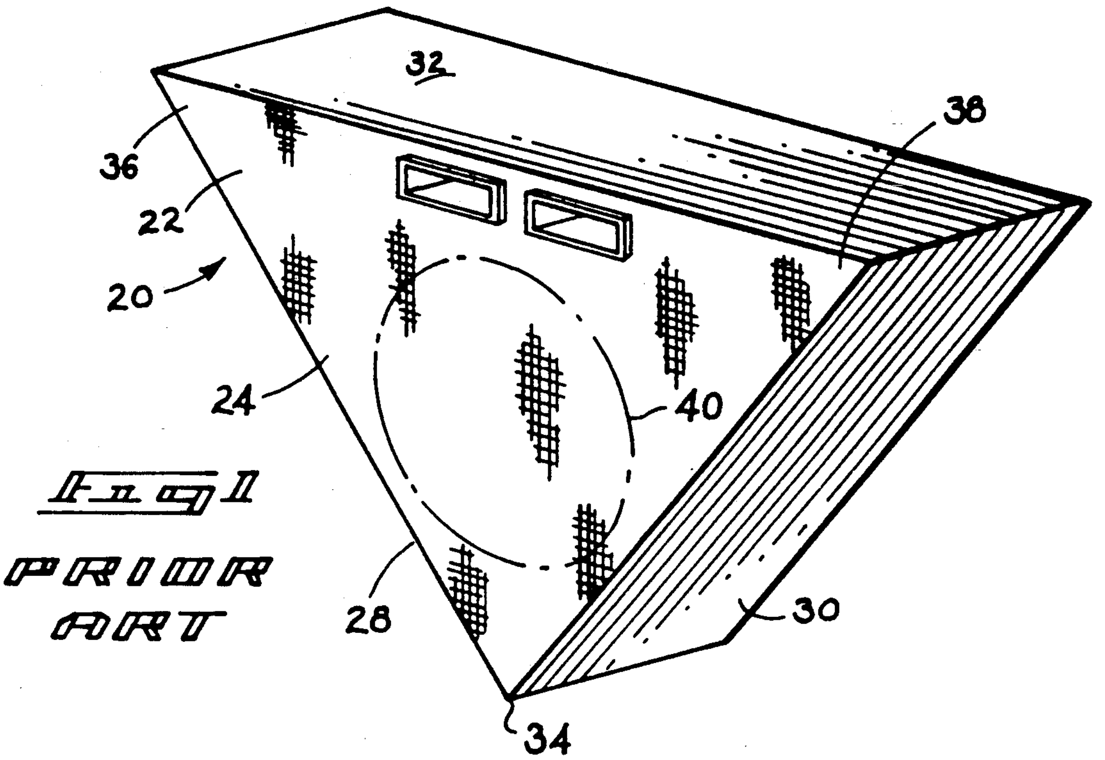
Fig 1 PRIOR ART
FIG. 1 is an isometric view of a prior art of a prior art triangular shaped sound reproduction speaker produced by the applicant.
Figure 2:
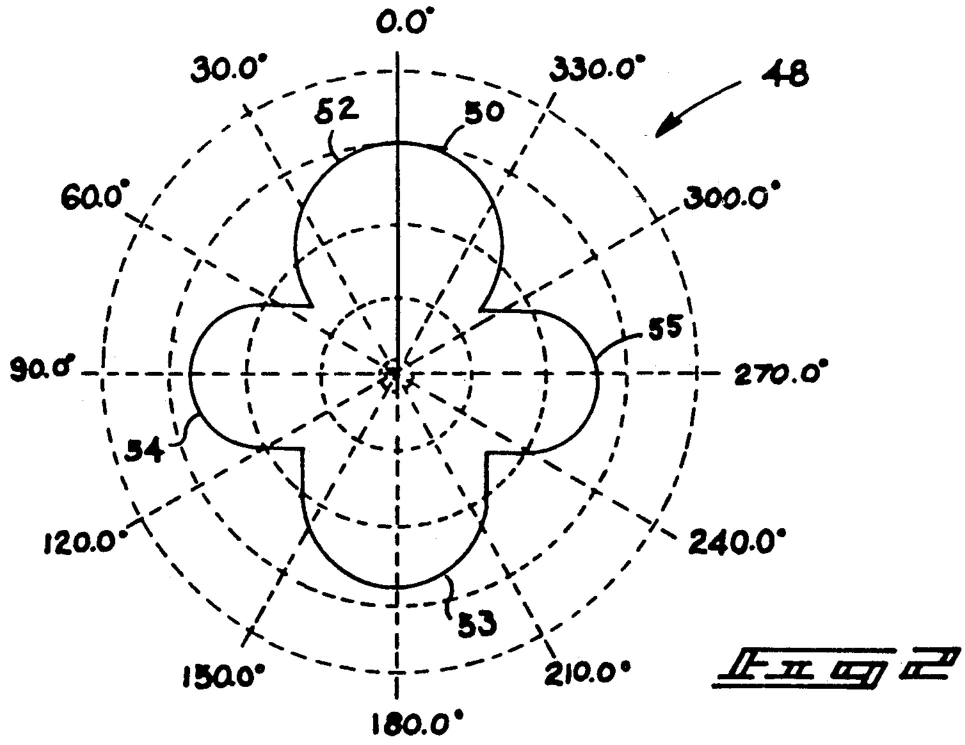
FIG. 2 is a polar graph illustrating the directional characteristics of the speaker shown in FIG. 1.
Figure 3:
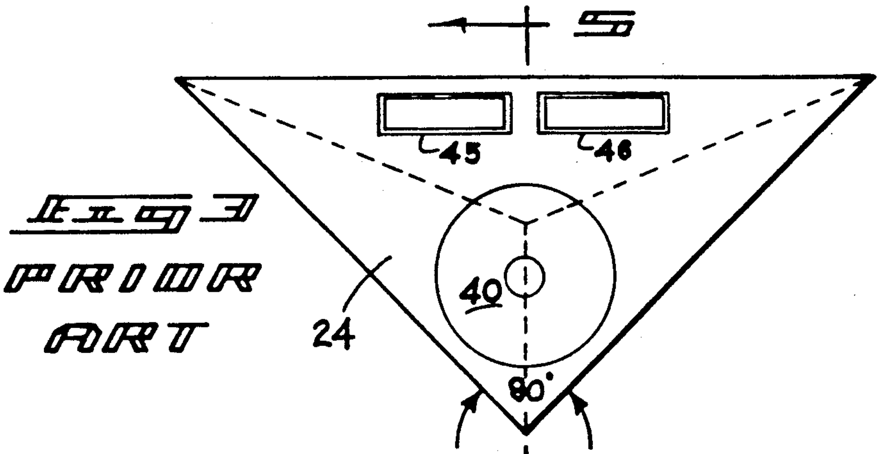
FIG 3 PRIOR ART
FIG. 3 is a front view of the speaker shown in FIG. 1.
Figure 4:
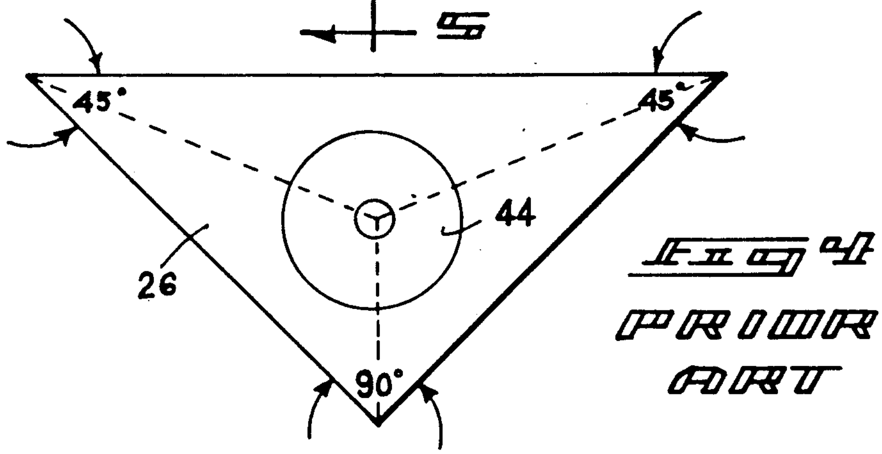
FIG 4 PRIOR ART
FIG. 4 is a rear view of the speaker shown in FIG. 1.
Figure 5:
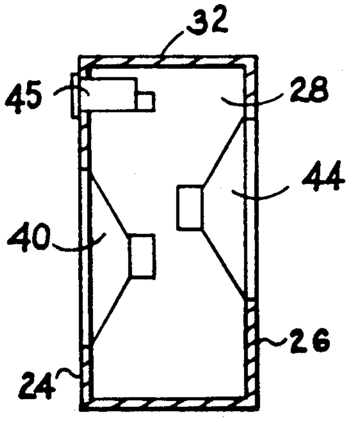
FIG 5 PRIOR ART
FIG. 5 is a vertical cross sectional view of the speaker shown in FIG. 1 taken along line 5—5 in FIG. 4.

Preferably, the speaker 70 further includes a tertiary sound reproduction element or driver 100 that is mounted in the front wall 72 above the primary driver 94 intermediate the corners 88 and 90 as illustrated in FIGS. 1 and 9. The tertiary element 100 is a mid-to-high frequency range driver. Preferably the driver 100 has a solid state electroacoustical piezoelectric transducer. In the preferred embodiment, the driver 100 is of a horn type. Alternatively the driver 100 may be of the dome type.

Preferably, the speaker 70 includes sound ports 102 and 104 that are formed in the front wall 72 adjacent the corners 88 and 90 respectively. Preferably the ports 102 and 104 are mounted symmetrically with respect to the primary driver 94 in which the horizontal distance "E" between the ports 102 and 104 is greater than the piston diameter "A" of the primary driver 94. Preferably the distance "E" between the ports 102, 104 is less than the height "C" of the enclosure 71.

In the embodiment illustrated in FIG. 14, each of the ports 102, 104 is formed with a tube 106 extending from the front wall 72 towards the rear wall 74, a distance "F". Preferably each of the ports 102, and 104 has an open cross sectional area of less than two square inches. The length "F" of the ports 102 and 104 as they extend from the front wall rearwardly is less than one half of the depth "D" of the enclosure.

Figure 6:
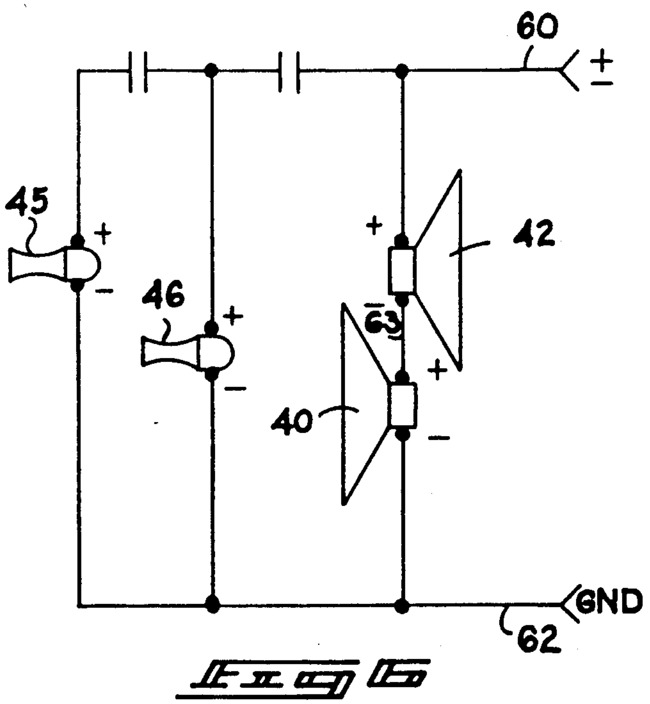
FIG 6 PRIOR ART
FIG. 6 is an electrical schematic of the electrical circuit of the speaker shown in FIG. 1.
Figure 12:
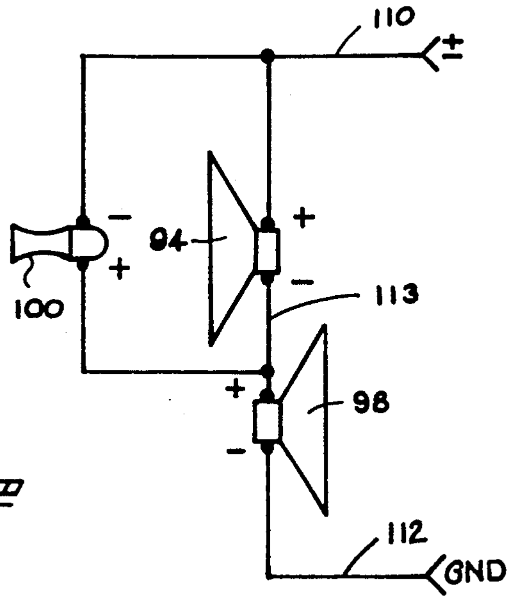
FIG. 12 is an electrical schematic view of the electrical circuit of the speaker shown in FIG. 7.

Now turning to the electrical schematics illustrated in FIGS. 12 and 13, it should be noted that the electrical connections of the primary and secondary drivers 94 and 98 have been reversed in comparison to their connection illustrated in the prior art design shown in FIG. 6. Furthermore, it should be noted that the tertiary driver 100 (mid-to-high frequency range) is mounted in parallel with only the front or primary driver 94 rather than in parallel with both the front and rear drivers. FIG. 12 illustrates the mounting utilized in a single tertiary driver 100 whereas FIG. 13 illustrates the mounting of two tertiary drivers 100 and 110 in the front wall 72. FIG. 12 shows an electrical schematic in which the AC signal line 110 is connected in parallel with the primary driver 94 and the tertiary driver 100. The ground or common line 112 is connected in series to the rear driver 98 in conjunction with the tertiary driver 110 and the primary driver 94. The circuit includes an interconnecting line 113 that interconnects the negative terminal of the primary driver 94 with the positive terminal of the rear driver 98. It should be specifically noted that the electrical circuit does not contain any crossover electronics or electrical circuitry with respect to the primary front driver 94 and the tertiary mid-to-high frequency range driver 100. The applicant has found that crossover circuitry is not required to obtain the outstanding directional characteristics that have been demonstrated.

FIG. 13 is quite similar to FIG. 12 except that it shows a second tertiary sound reproduction element 114 (mid-to-high frequency range driver). Preferably, it has a solid state piezoelectric transducer. An AC signal line 116 is initially connected the positive terminal of the primary driver 94 and to the negative terminals of the tertiary drivers 100 and 114. The circuit includes a common or ground line 118 that is connected to the negative terminal of the rear driver 98. The circuit has an interconnected line 120 that extends from the negative terminal on the primary driver 94 extends to the positive terminal on the rear driver 98 and then is interconnected to the positive terminals of the mid-to-high frequency range drivers 100 and 114. It should be noted that the applicant is able to obtain the wide and highly desirable directional characteristics without using crossover electronics or circuitry. The speaker 70 is able to obtain phase coherency and wide directionality as is evident in polar graph 125 illustrated in FIG. 8. The polar graph 125 includes a wave propagation response line 128 at a common intensity in a 360° direction about the speaker assuming the speaker is mounted at the center with the front wall 72 directed at the zero orientation. It should be noted that the pressure wave line 128 has a wide directional arc 130 of greater than 180° in the forward direction. This should be compared with respect to the wave pattern illustrated in FIG. 2. Of particular importance is the very broad wave front segment 134 that is substantially constant throughout the entire frontal arc of 180° with very little intensity degradation throughout the entire 180° frontal projection. Speaker 70 is able to provide a very favorable wide directional characteristic to maintain the intensity of the sound substantially uniform in the entire arc 134 in front of the speaker to provide an even, high intensity sound from a very small compact unit.

In has been found that the enclosure 71 has, in additional to a lower fundamental resonance frequency, a predominant upper fundamental resonance frequency at approximately 2978 Hz$\pm$3%. It has been found through experimentation that optimum performance can be obtained by selecting drivers 94 and 98 having free air resonance frequencies prior to mounting in the enclosure 71 that are the square root of the upper fundamental resonance frequency of the enclosure 71. Consequently it is preferable that the drivers 94 and 98 have free air resonance frequencies of 55 Hz$\pm$3%.

In an alternate embodiment illustrated in FIGS. 15–17, the speakers 70 are arranged in what is termed a "hourglass" shaped sound reproduction speaker 140 that includes an upper hourglass section 142 that is tapered downward similar to the speaker 70 illustrated in FIG. 7 and a lower hourglass section 144 that is tapered upwardly similar to the inversion of the speaker 70 illustrated in FIG. 7. Preferably the sound reproduction speaker 140 illustrated in FIGS. 15–17 is an integration of two of the speakers 70, one in the upright orientation illustrated in FIG. 7 and second in an inverted orientation for the lower section 144. The two sections 142 and 144 may be integrally formed in which the side walls 76 and 78 are merely extended forming integral elements. Alternatively, the two units may be manufactured separately and attached or fixed rigidly to each other.

Although the combined hourglass speaker 140 contains the same physical relationships as previously discussed, it is found that the upper fundamental resonance frequency, rather than being 2978 Hz$\pm$3% is 1930 Hz$\pm$3%. In this configuration, the front drivers 94 and the rear drivers 98 should preferably have free air resonance frequencies of 44 Hz$\pm$3%. Such an arrangement provides for a very optimum configuration.

In compliance with the stature, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A sound reproduction speaker, comprising:

a speaker enclosure having:

a. an isosceles triangular-shaped front wall with isosceles side edges extending outward from an apex at an apex angle to a width side edge, opposite the apex, forming corners with side angles between the isosceles side edges and the width side edge; in which the length of the width side edge defines the width of the enclosure and the normal distance between the width side edge and the apex defines the height of the enclosure;

b. an isosceles triangular-shaped rear wall parallel with and spaced from the front wall a distance defining a depth of the enclosure;

c. side walls extending between the front and rear walls enclosing the enclosure;

a first sound reproduction element mounted in the front wall for creating and directing sound waves outward from the front wall, said first sound reproduction element having a dynamically operated diaphragm with a prescribed piston circumference;

a second sound reproduction element mounted in the rear wall and having a dynamically operated diaphragm for creating and directing sound waves outward from the rear wall;

wherein said width of the enclosure is substantially equal to the prescribed piston circumference of the first sound reproduction element; and wherein said height of the enclosure is equal to or less than the width of the enclosure in which the apex angle is between 74.5 degrees and 79 degrees inclusive.

2. The sound reproduction speaker as defined in claim 1 wherein the second sound reproduction element has a piston circumference equal to or greater than the piston circumference of the first sound reproduction element.

3. The sound reproduction speaker as defined in claim 1 wherein the apex angle is approximately 78.4 degrees.

4. The sound reproduction speaker as defined in claim 1 wherein the first sound reproduction element is mounted in the front wall closer to the isosceles side edges than the width side edge.

5. The sound reproduction speaker as defined in claim 1 further comprising sound emitting ports formed in the front wall adjacent respective corners.

6. the sound reproduction speaker as defined in claim 5 wherein the ports are spaced a distance that is less than the height of the enclosures.

7. The sound reproduction speaker as defined in claim 6 wherein the first sound reproduction element has prescribed piston diameter and wherein the distance between the ports is greater than the piston diameter.

8. The sound reproduction speaker as defined in claim 5 wherein each port has a cross section that is less than 2 square inches.

9. The sound reproduction speaker as defined in claim 5 wherein each port has a length that is less than one-half of the depth of the enclosure.

10. The sound reproduction speaker as defined in claim 1 wherein the enclosure has an upper fundamental resonance frequency at approximately 2978 Hertz.

11. The sound reproduction speaker as defined in claim 10 wherein the first sound reproduction element has a free air resonance frequency of approximately 55 Hertz.

12. The sound reproduction speaker as defined in claim 1 wherein the enclosure has an upper fundamental resonance frequency and wherein the first sound reproduction element has a free air resonance frequency that is approximately the square root of the upper fundamental resonance frequency of the speaker.

13. The sound reproduction speaker as defined in claim 1 further comprising a third sound reproduction element mounted in the front wall adjacent the width side edge and intermediate the corners of the enclosure.

14. The sound reproduction speaker as defined in claim 13 wherein the third sound reproduction element has a piezoelectric transducer for generating sound waves.

15. The sound reproduction speaker as defined in claim 1 wherein the first sound reproduction element has a transducer with multiple voice coils.

16. A sound reproduction speaker, comprising:

a speaker enclosure having:

a. an isosceles triangular-shaped front wall with isosceles side edges extending outward from an apex at an apex angle to a width side edge, opposite the apex, forming corners with side angles between the isosceles side edges and the width side edge; in which the length of the width side edge defines the width of the enclosure and the normal distance between the width side edge and the apex defines the height of the enclosure;

b. an isosceles triangular-shaped rear wall parallel with and spaced from the front wall a distance defining a depth of the enclosure;

c. side walls extending between the front and rear walls enclosing the enclosure;

a first sound reproduction element mounted in the front wall for creating and directing sound waves outward from the front wall, said first sound reproduction element having a dynamically operated diaphragm with a prescribed piston circumference;

a second sound reproduction element mounted in the rear wall and having a dynamically operated diaphragm for creating and directing sound waves outward for the rear wall; and wherein said apex angle is between 74.5 and 79 degrees inclusive.

17. The sound reproduction speaker as defined in claim 16 wherein the second sound reproduction speaker has a piston circumference equal to or greater than the piston circumference of the first sound reproduction speaker.

18. The sound reproduction speaker as defined in claim 16 wherein the apex angle is approximately 78.4 degrees.

19. The sound reproduction speaker as defined in 16 wherein the first sound reproduction element is mounted in the front wall closer to the isosceles side edges than the width side edge.

20. The sound reproduction speaker as defined in claim 16 further comprising sound emitting ports formed in the front wall adjacent respective corners.

21. The sound reproduction speaker as defined in claim 20 wherein the ports are spaced a distance that is less than the height of the enclosures.

22. The sound reproduction speaker as defined in claim 20 wherein the first sound reproduction element has a prescribed piston diameter and wherein the distance between the ports is greater than the piston diameter.

23. The sound repoduction speaker as defined in claim 20 wherein each port has a cross-section that is less than 2 square inches.

24. The sound reproduction speaker as defined in claim 20 wherein each port has a length that is less than one-half of the depth of the enclosure.

25. The sound reproduction speaker as defined in claim 16 wherein the enclosure has an upper fundamental resonance frequency at approximately 2978 Hertz.

26. The sound reproduction speaker as defined in claim 16 wherein the first sound reproduction element has a free air resonance frequency of approximately 55 Hertz.

27. The sound reproduction speaker as defined in claim 16 wherein the enclosure has an upper fundamental resonance frequency and wherein the first sound reproduction element has a free air resonance frequency that is approximately the square root of the upper fundamental resonance frequency of the speaker.

28. The sound reproduction speaker as defined in claim 16 further comprising a third sound reproduction element mounted in the front wall adjacent the width side edge and intermediate the corners of the enclosure.

29. The sound reproduction speaker as defined in claim 28 wherein the third sound reproduction element has a piezoelectric transducer for generating sound waves.

30. The sound reproduction speaker as defined in claim 16 wherein the first sound reproduction element has a transducer with multiple voice coils.

31. The sound reproduction speaker as defined in claim 29 wherein the first sound reproduction element is electrically interconnected in parallel with the third sound reproduction element without a cross-over circuit.

32. The sound reproduction speaker as defined in claim 16 wherein the width of the enclosure is substantially equal to the prescribed piston circumference of the first sound reproduction element.

33. The sound reproduction speaker as defined in claim 16 wherein the height of the enclosure is equal to or less than the width of the enclosure.

34. A sound reproduction speaker, comprising:

a speaker enclosure having:

a. an isosceles triangular-shaped front wall with isosceles side edges extending outward from an apex at an apex angle to a width side edge, opposite the apex, forming corners with side angles between the isosceles side edges and the width side edge; in which the length of the width side edge defines the width of the enclosure and the normal distance between the width side edge and the apex defines the height of the enclosure;

b. an isosceles triangular-shaped rear wall parallel with and spaced from the front wall a distance defining a depth of the enclosure;

c. side walls extending between the front and rear walls enclosing the enclosure;

a first sound reproduction element mounted in the front wall for creating and directing sound waves outward from the front wall, said first sound reproduction element having a dynamically operated diaphragm with a prescribed piston circumference;

a second sound reproduction element mounted in the rear wall and having a dynamically operated diaphragm for creating and directing sound waves outward from the rear wall; and wherein said enclosure has an upper fundamental resonance frequency and wherein the first sound reproduction element has a free air resonance frequency which is substantially the square root of the upper fundamental resonance frequency of the speaker.

35. The sound reproduction speaker as defined in claim 35 wherein the enclosure has a lower fundamental resonance frequency and wherein the upper fundamental resonance frequency is between the fourth and fifth order of the lower fundamental resonance frequency.

36. The sound reproduction speaker as defined in claim 34 wherein the apex angle is between 74.5 and 79 degrees inclusive.

37. The sound reproduction speaker as defined in claim 36 wherein the apex angle is approximately 78.4 degrees.

38. The sound reproduction speaker as defined in claim 34 wherein the first sound reproduction element is mounted in the front wall closer to the isosceles side edges than the width side edge.

39. The sound reproduction speaker as defined in claim 34 further comprising sound emitting ports formed in the front wall adjacent respective corners.

40. The sound reproduction speaker as defined in claim 39 wherein the first sound reproduction element has a prescribed diaphragm piston diameter and wherein the distance between the ports is greater than the piston diameter.

41. The sound reproduction speaker as defined in claim 39 wherein each port has a cross-section that is less than 2 square inches.

42. The sound reproduction speaker as defined in claim 35 wherein the enclosure has a fundamental resonance frequency of approximately 2978 Hertz.

43. The sound reproduction speaker as defined in claim 42 wherein the first sound reproduction element has a free air resonance frequency of approximately 55 Hertz.

44. The sound reproduction speaker as defined in claim 34 further comprising a third sound reproduction element mounted in the front wall adjacent the width side edge and intermediate the corners of the enclosure.

45. The sound reproduction speaker as defined in claim 44 wherein the third sound reproduction element has a piezoelectric transducer for generating sound waves.

46. The sound reproduction speaker as defined in claim 35 wherein the first sound reproduction element has a transducer with multiple voice coils.

47. The sound reproduction speaker as defined in claim 44 wherein the first sound reproduction element is electrically interconnected in parallel with the third sound reproduction element without a cross-over circuit.

48. The sound reproduction speaker as defined in claim 34 wherein the first sound reproduction element has a diaphragm piston of a prescribed circumference and wherein the width of the enclosure is substantially equal to the prescribed circumference.

49. The sound reproduction speaker as defined in claim 34 wherein the height of the enclosure is equal to or less than the width of the enclosure.

50. An hourglass shaped sound reproduction speaker, comprising:

a speaker enclosure having;

a an upper hourglass section having a downwardly directed taper;

b. a lower hourglass section operatively connected to the upper hourglass section and having a upwardly directed taper;

c. each hourglass section having;

1) an isosceles triangular-shaped front wall with isosceles side edges extending outward from an apex at an apex angle to a width side edge, opposite the apex, forming corners with side angles between the isosceles side edges and the width side edge; in which the length of the width side edge defines the width of the hourglass section and the normal distance between the width side edge and the apex defines the height of the hourglass section;

2) an isosceles triangular-shaped rear wall parallel with and spaced from the front wall a distance defining a depth of the hourglass section;

3) side walls extending between the front and rear walls enclosing the hourglass section;

a first sound reproduction element mounted in the front wall for creating and directing sound waves outward from the front wall, said first sound reproduction element having a dynamically operated diaphragm with a prescribed piston circumference;

a second sound reproduction element mounted in the rear wall and having a dynamically operated diaphragm for creating and directing sound waves outward from the rear wall;

wherein said width of the lower hourglass section is substantially equal to the prescribed piston circumference of its first sound reproduction element; and wherein said height of the lower hourglass section is equal to or less than the width of the lower hourglass section.

51. The hourglass shaped sound reproduction speaker as defined in claim 50 wherein the depth of the lower hourglass section is approximately one half of the width of the lower hourglass section.

52. The hourglass shaped sound reproduction speaker as defined in claim 51 wherein the apex angle of the lower hourglass section is between 74.5 and 79 degrees inclusive.

53. The hourglass shaped sound reproduction speaker as defined in claim 52 wherein the apex angle of the lower hourglass section is approximately 78.4 degrees.

54. The hourglass shaped sound reproduction speaker as defined in claim 50 wherein each first sound reproduction element is mounted in is corresponding front wall closer to the isosceles side edges than the width side edge.

55. The hourglass shaped sound reproduction speaker as defined in claim 50 further comprising sound emitting ports formed in the front wall of the lower hourglass section adjacent respective corners.

56. The hourglass shaped sound reproduction speaker as defined in claim 55 wherein the ports are spaced a distance that is less than the height of the lower hourglass section.

57. The hourglass shaped sound reproduction speaker as defined in claim 56 wherein the first sound reproduction element has prescribed piston diameter and wherein the distance between the ports is greater than the piston diameter.

58. The hourglass shaped sound reproduction speaker as defined in claim 55 wherein each port has a cross section that is less than 2 square inches.

59. The hourglass sound reproduction speaker as defined in claim 50 wherein the enclosure has an upper fundamental resonance frequency of approximately 1930 Hertz.

60. The hourglass sound reproduction speaker as defined in claim 59 wherein the first sound reproduction element of the lower hourglass section has a free air resonance frequency of approximately 45 Hertz.

61. The hourglass sound reproduction speaker as defined in claim 50 wherein the enclosure has an upper fundamental resonance frequency and wherein the first sound reproduction element of the lower hourglass section has a free air resonance frequency that is approximately the square root of the upper fundamental resonance frequncy of the enclosure.

62. The hourglass shaped sound reproduction speaker as defined in claim 50 wherein each hourglass section has a third sound reproduction element mounted in the corresponding front wall adjacent the width side edge and intermediate the corners of the hourglass section.

63. The hourglass shaped sound reproduction speaker as defined in claim 62 wherein the third frequency sound reproduction element is electrically connected in parallel with the first sound reproduction element and has a piezoelectric transducer for generating sound waves.

64. The hourglass shaped sound reproduction speaker as defined in claim 50 wheren each of the first sound reproduction elements has a transducer with multiple voice coils.

* * * * *